US011632874B1

(12) United States Patent
Zhang et al.

(10) Patent No.: US 11,632,874 B1
(45) Date of Patent: Apr. 18, 2023

(54) REGULATING AIRFLOW IN A COMPUTER SYSTEM

(71) Applicant: ZT Group Int'l, Inc., Secaucus, NJ (US)

(72) Inventors: Bo Zhang, Secaucus, NJ (US); Ting Yu Lin, Secaucus, NJ (US)

(73) Assignee: ZT Group Int'l, Inc., Secaucus, NJ (US)

(*) Notice: Subject to any disclaimer, the term of this patent is extended or adjusted under 35 U.S.C. 154(b) by 159 days.

(21) Appl. No.: 16/935,442

(22) Filed: Jul. 22, 2020

(51) Int. Cl.
*H05K 7/20* (2006.01)
*F24F 13/08* (2006.01)

(52) U.S. Cl.
CPC ......... *H05K 7/20145* (2013.01); *F24F 13/08* (2013.01); *H05K 7/20181* (2013.01); *F15B 2201/405* (2013.01); *F15B 2215/30* (2013.01)

(58) Field of Classification Search
CPC .. F24F 13/08; F24F 2013/40; H05K 7/20145; H05K 7/20181; F15B 2201/405; F15B 2201/42; F15B 2215/30; Y10T 137/7847; Y10T 137/2703; Y10T 137/7836; Y10T 137/7879
USPC ........................................................ 454/184
See application file for complete search history.

(56) References Cited

U.S. PATENT DOCUMENTS 4,064,905 A * 12/1977 Nilsson ................ G05D 7/0173 137/499
4,263,842 A * 4/1981 Moore .................... F24F 13/15 415/908
4,362,091 A * 12/1982 Cox .................... F24F 13/0263 62/299
4,377,968 A * 3/1983 Gerry ...................... F24F 13/08 454/227
6,508,246 B1 * 1/2003 Fiedler .................... F23L 13/02 137/520
6,817,378 B2 * 11/2004 Zelczer ............... F15B 15/1428 92/248
7,349,211 B2 * 3/2008 Chen ................. H05K 7/20172 415/213.1
8,641,494 B2 * 2/2014 Matthews ............ G10K 11/161 454/262
9,615,485 B1 * 4/2017 Pitwon ............... H05K 7/20209
10,368,466 B1 * 7/2019 Frink ................. H05K 7/20736
10,433,464 B1 * 10/2019 Lin .................... H05K 7/20736
(Continued)

FOREIGN PATENT DOCUMENTS

CN 205003556 U * 1/2016 ............... B05B 1/30
CN 105700651 A * 6/2016 ............... G06F 1/20
(Continued)

*Primary Examiner* — Edelmira Bosques
*Assistant Examiner* — Frances F. Hamilton
(74) *Attorney, Agent, or Firm* — Dergosits & Noah LLP; Todd A. Noah

(57) ABSTRACT

An apparatus and method provide a barrier in the cooling airflow of a component of a computing device that, when the barrier is extended, impedes the airflow, thereby diverting excess cooling airflow from the component to a different component with a different flow path. In response to increased pressure from the airflow, the barrier retracts to permit a greater airflow. Embodiments respond to an increase or decrease in airflow without requiring additional control input and include barriers that deform or pivot in response to increased pressure to permit greater airflow.

7 Claims, 15 Drawing Sheets

514 500 506 506 512 508 516 504 512 502 510 502

(56) References Cited

U.S. PATENT DOCUMENTS 10,624,241 B1* 4/2020 Ross .................. H05K 7/20736
10,888,028 B2* 1/2021 Yang .................. H05K 7/20618
2001/0025862 A1* 10/2001 Brown .............. B65D 47/2031 222/490
2003/0017799 A1* 1/2003 Hayashi ................ B60H 1/249 454/162
2003/0224717 A1* 12/2003 Tsai .................... H05K 7/2019 454/184
2005/0095970 A1* 5/2005 Ito ...................... B60H 1/00678 454/96
2006/0237073 A1* 10/2006 Kuo .......................... F24F 7/06 137/845
2009/0065595 A1* 3/2009 Kates ....................... F24F 11/76 236/49.3
2010/0317278 A1* 12/2010 Novick ................ F24F 11/0001 62/401
2010/0319275 A1* 12/2010 O'Leary ............... E04F 13/002 52/173.1
2011/0235272 A1* 9/2011 Bash .................. H05K 7/20727 361/692
2012/0312510 A1* 12/2012 Eckberg .............. H01L 23/3672 165/104.19
2014/0301832 A1* 10/2014 Errick .................. B60H 1/3407 415/151
2015/0069897 A1* 3/2015 Chen ......................... G06F 1/20 49/358
2015/0147950 A1* 5/2015 Klein ................. B60H 1/00849 454/152
2015/0219358 A1* 8/2015 Alfakhrany .............. F24F 11/46 454/366
2015/0282348 A1* 10/2015 Wang ................. H05K 7/20181 312/236
2016/0215999 A1* 7/2016 Bard .................. H05K 7/20736
2017/0094833 A1* 3/2017 Pitwon ............... H05K 7/20145
2019/0219300 A1* 7/2019 Scholten ............. F24F 13/1426
2019/0274231 A1* 9/2019 Gopalakrishna ........ F24F 13/14
2020/0039065 A1* 2/2020 Manfredi ................. B25J 9/142
2020/0068741 A1* 2/2020 Waters ...................... G06F 1/20
2021/0041131 A1* 2/2021 Arcarons Alibes .......................... F24F 13/0236
2021/0240238 A1* 8/2021 Tsai ................... H05K 7/20209

FOREIGN PATENT DOCUMENTS

CN 112105182 A * 12/2020 ............. B01D 53/26
DE 0362913 A1 * 8/1989
DE 4317734 A1 * 12/1993 ............ F24F 11/047
DE 202008014690 U1 * 4/2010 ............ F24F 11/043
DE 102015101097 A1 * 7/2016 ........... B60H 1/3414
FR 2527803 A1 * 5/1982
JP 2008210017 A * 9/2008 ........... G11B 33/142
JP 2013065063 A * 4/2013
KR 20070050565 A * 11/2005
KR 20090059557 A * 12/2007
KR 101317441 B1 * 10/2013

* cited by examiner

Step 1
1002
1003
500a
508a
506a
Step 2
1004
1005
500a
508b
506b
Step 3
500b
506c
508c
1007
1002
500a
1004
1009
508d
506d
Step 4
1000
108
106
110

REGULATING AIRFLOW IN A COMPUTER SYSTEM

BACKGROUND

Existing methods for regulating airflow through a computer system typically do not optimize the airflow through each of the various heat-producing elements within the system. In addition, and particularly for cloud-computing servers in data centers, the fans in the vast number of computing systems are a major power consumer and source of noise. The noise may be a concern because of its effects on personnel health. For an example of a specification that addresses noise concerns, see the Amazon.com Datacenter Server Specification, Server Platform and Rack Thermal Specification, 800-003556G.

Fan speeds are typically optimized to address the cooling requirements of the component that is nearest and still lower than its thermal design temperature. In some standards (e.g., Amazon Web Services Snowball V3.0 Server Product Specification, 800-034166-001, Dec. 5, 2018), the criteria for whether an optimization is achieved is whether the "worst" (or relative "hottest") component is operating within a 3° C. margin of its thermal design temperature. For example, 92°-94° C. falls in the range of the 3° C. margin for a CPU with a design temperature limit for 95° C. However, in real applications and designs, Fan Speed Control (FSC) can meet the 3° C. margin criteria for every component in a system only for a limited range of operating conditions.

For example, an FSC may, at one set of server operating conditions, optimize fan power utilization for one component, but the results may vary regarding how optimal the optimization is for other components. FIG. 1 is a schematic diagram illustrating a computer system 110, e.g., a server, operating at an ambient temperature of 45° C. with maximum system GPU and CPU loading and a fan speed of 100% maximum RPM. In FIG. 1, airflow 100 cools a GPU 104 and airflow 102 cools a CPU with heatsink (HS) 106. Airflows 100 and 102 are created by fans 108 creating a low pressure area between fans 108 and GPU 104 and CPU 106 that draws air into server 110 and over GPU 104 and CPU 106. At the condition illustrated in FIG. 1, the cooling of both GPU 104 and CPU 106 can typically be designed to meet a target 3° C. margin. FIG. 2 is a schematic diagram illustrating computer system 110 operating at an ambient temperature of 25° C. with maximum system GPU and CPU loading and a fan speed of 40% maximum RPM. Where the cooling of both GPU 104 and CPU 106 may be designed to meet a target 3° C. margin at the conditions of FIG. 1, the target 3° C. margin is typically not met at the conditions of FIG. 2, i.e., when the ambient temperature drops to 25° C. At the conditions illustrated in FIG. 2, perhaps only GPU 104 meets the target 3° C. margin, with CPU 106 exceeding the margin. The fact that CPU 106 exceeds the margin means that at the 25° C. ambient condition, while airflow 200 through GPU 104 may be optimized, airflow 202 through CPU 106 is more than sufficient, i.e., airflow 202 is excessive.

Thus, what is needed is a system and method that optimizes the airflow though both the GPU and CPU at the same time for maximum loading conditions at various ambient temperatures.

BRIEF DESCRIPTION OF THE DRAWINGS

The embodiments are illustrated by way of example and not limitation in the accompanying drawings, in which like references indicate similar elements, and in which.

DETAILED DESCRIPTION

Figure 1:
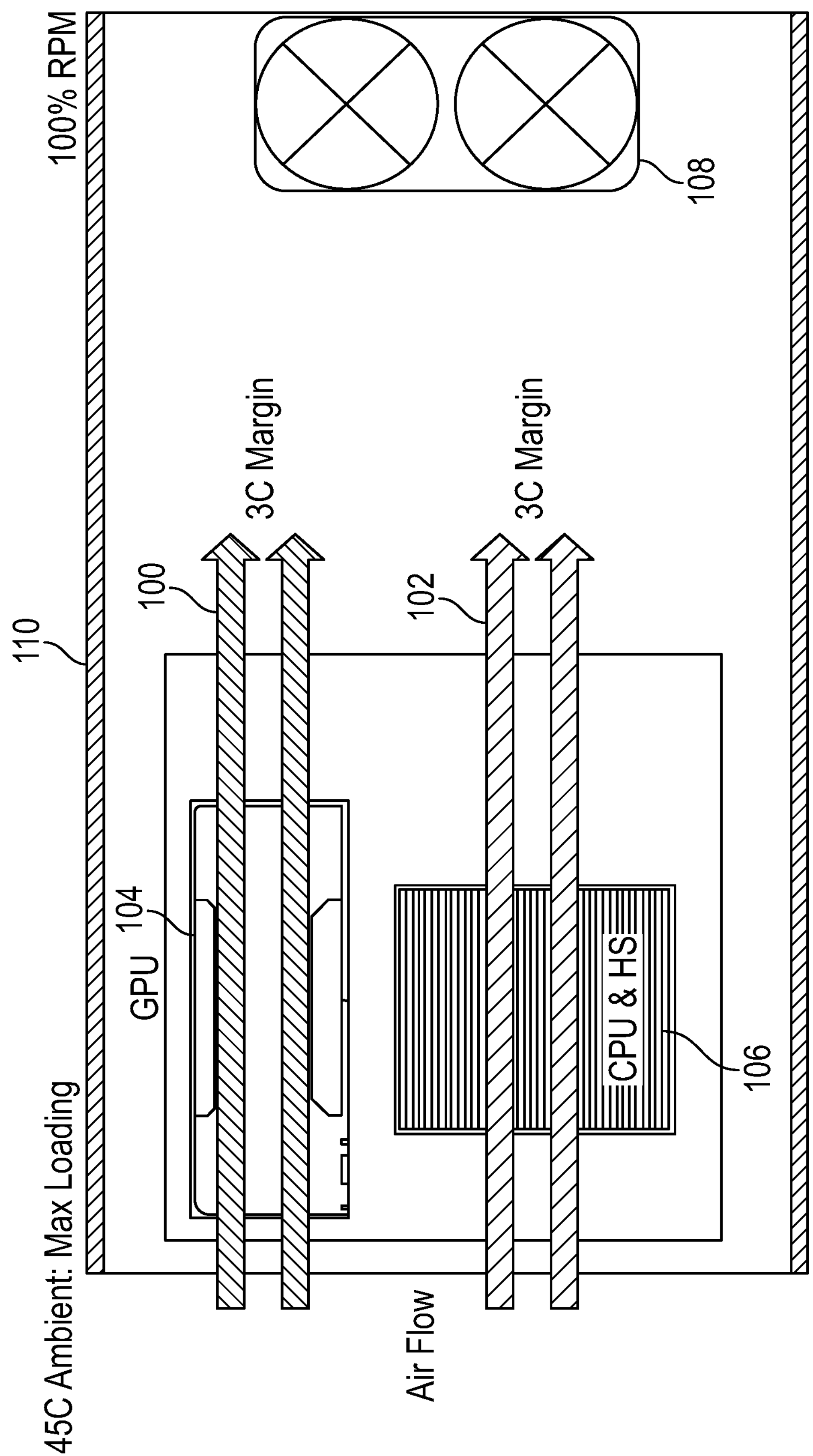
FIG. 1 is a schematic diagram illustrating a computer system operating at an ambient temperature of 45° C. with maximum system GPU and CPU loading and maximum fan speed.
Figure 2:
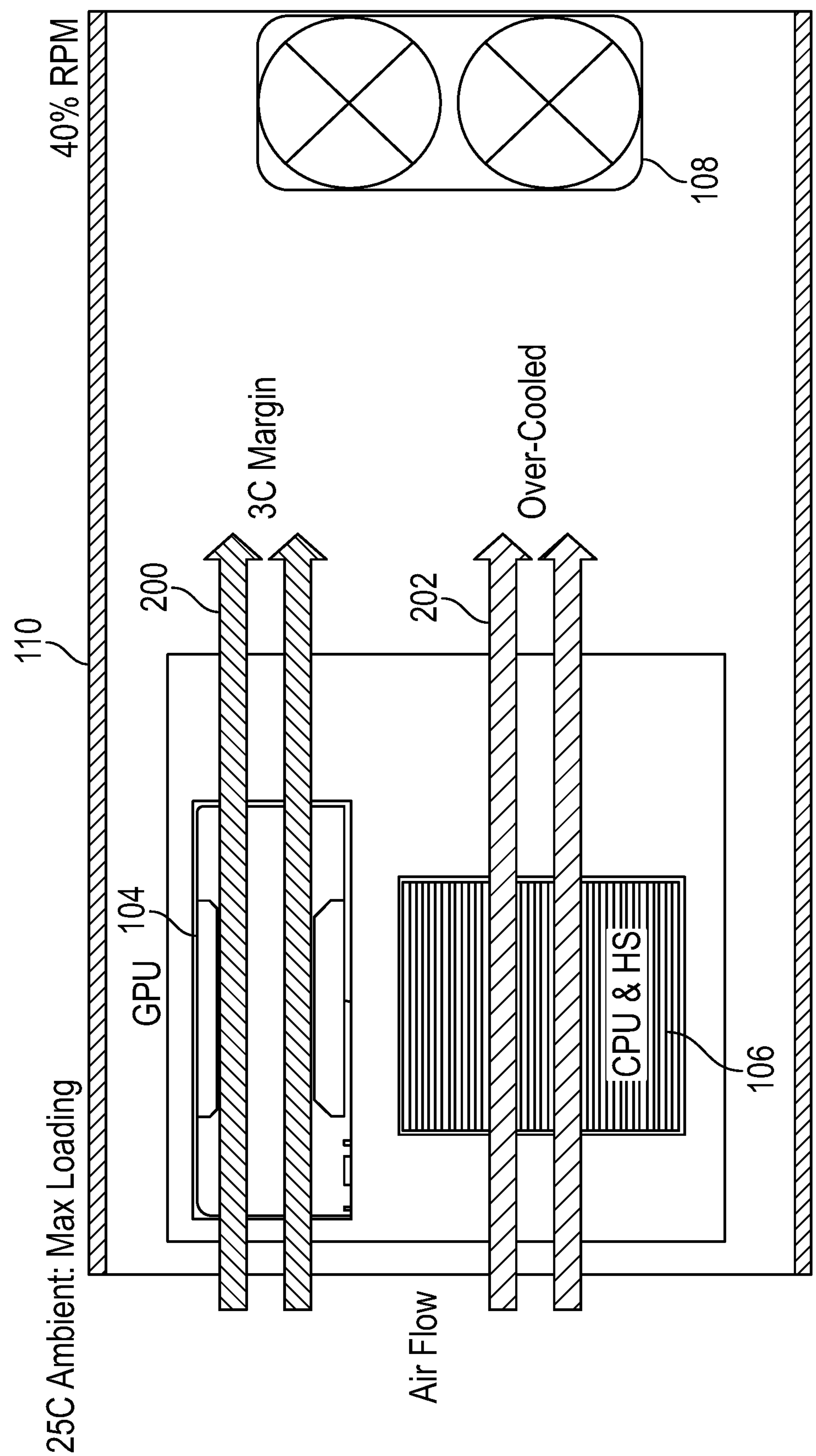
FIG. 2 is a schematic diagram illustrating the computer system of FIG. 1 operating at an ambient temperature of 25° C. with maximum system GPU and CPU loading and a reduced fan speed.
Figure 4:
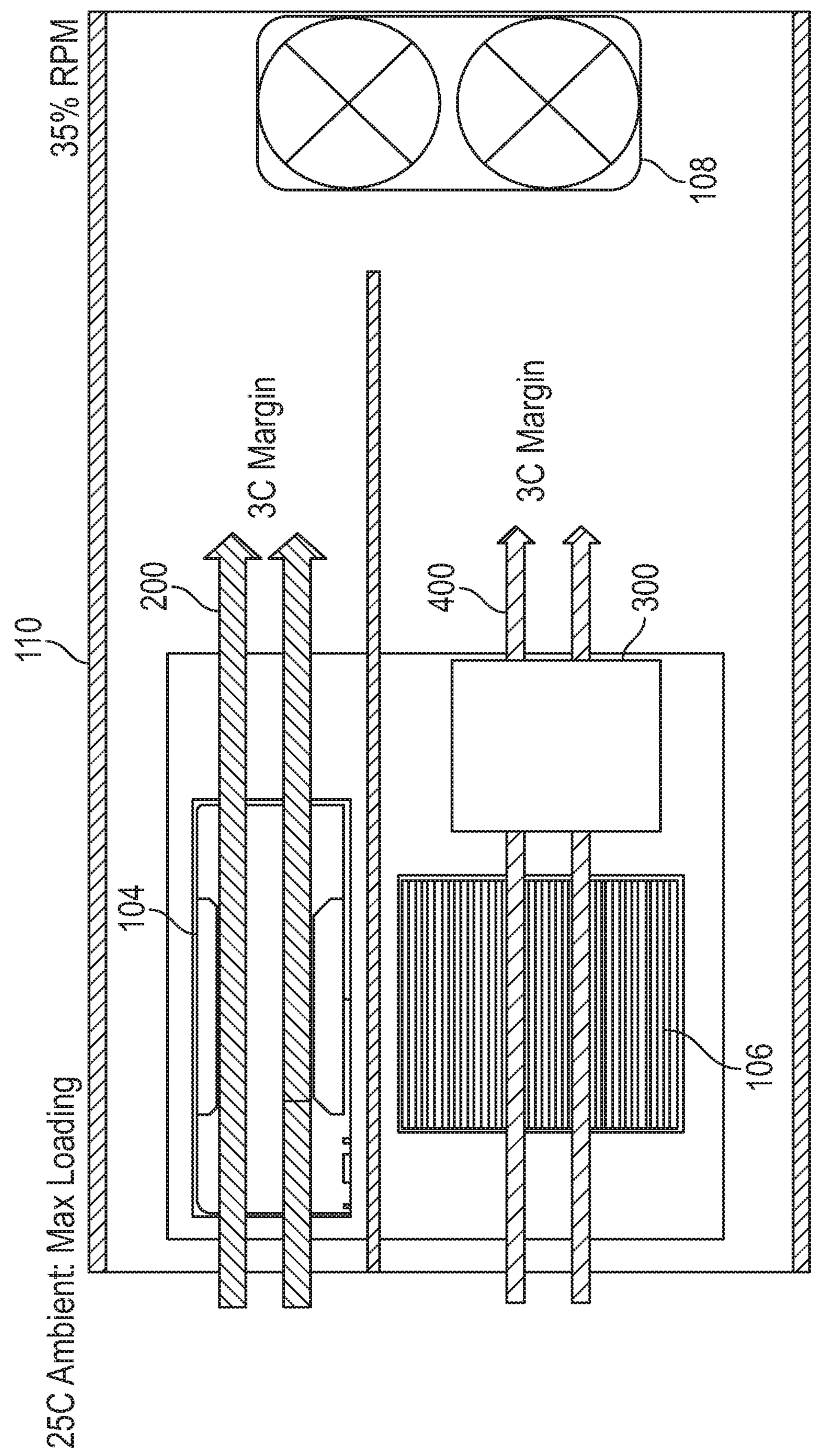
FIG. 4 is a schematic diagram of the embodiment of FIG. 3A employed in a computer system operating at an ambient temperature of 25° C. with maximum system GPU and CPU loading and a reduced fan speed.

The subject matter discloses embodiments of an apparatus and method for regulating airflow within a computer system. As shown in FIG. 2, one component may be optimally cooled (e.g., GPU 104) while a second component may be overcooled (e.g., CPU 106). In embodiments, excess airflow from the over-cooled component may be diverted to the component that is operating at the 3C margin by preventing the excess airflow from passing by the over-cooled component. In embodiments, a restriction may be placed in the flow path of the component that is overcooled at weaker airflows (e.g., the 40% RPM of FIG. 2), diverting air to the component that is nearer or at the 3° C. margin. As a result the fan speed may be reduced (e.g., to 35% RPM as shown in FIG. 4). In the embodiments, as the ambient temperature increases and the fan speed increases to compensate, the restriction opens and permits greater flow, so that the previously over-cooled component is adequately cooled at the new ambient temperature.

The result is that, in embodiments, the system fan speed may be reduced for certain determined ambient temperatures, with a corresponding reduction in system noise and power consumption. If, in FIG. 2, the excess of airflow that is overcooling CPU 106 can be directed from CPU 106 to GPU 104, fan power can be saved by lowering the fan RPM (e.g., to less than 40%). Embodiments aim to maintain the 3° C. margin criteria for multiple components (in this example both CPU and GPU) for both 45° C. ambient and also 25° C. ambient conditions, which result in the saving of a considerable amount of power. In addition, by lowering the fan RPM the acoustic conditions of a data center should be improved. As a result, for a data center with servers each equipped with a typical 8056 fan (a total fan power of 100 W), a 5% fan RPM decrease could save a million dollars in yearly operating costs.

Figure 3A:
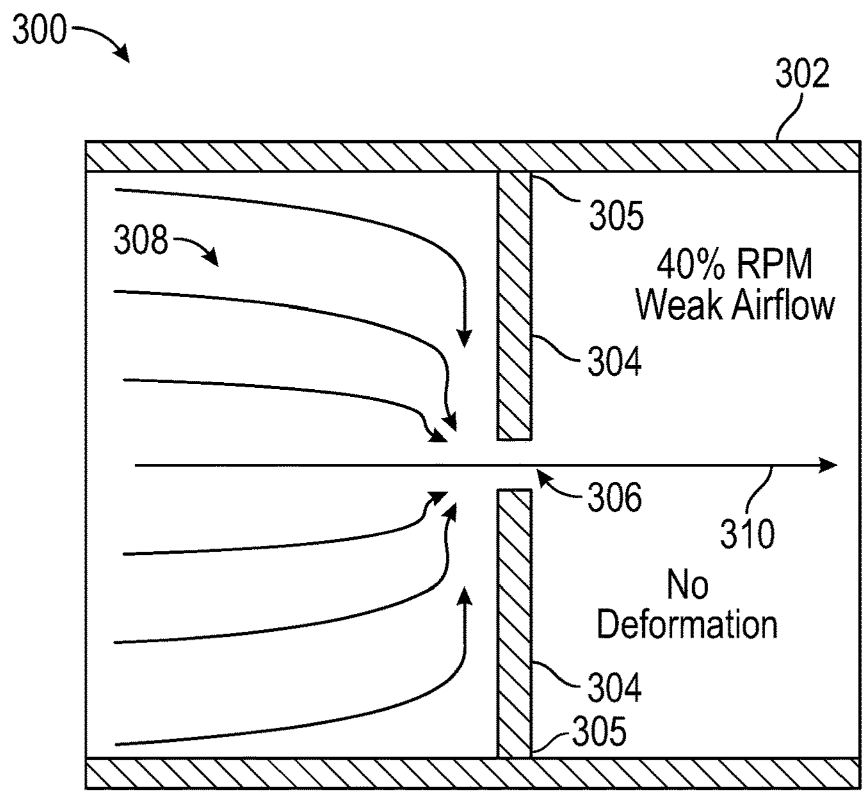
FIG. 3A is a schematic diagram of an apparatus for regulating airflow according to an embodiment in a first state.
Figure 3B:
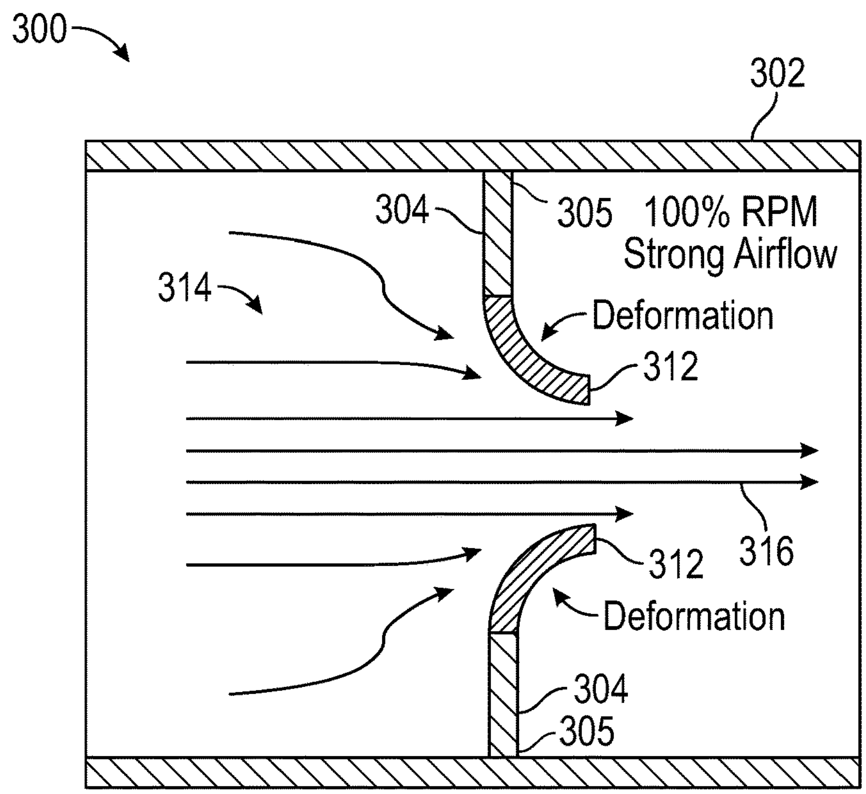
FIG. 3B is a schematic diagram of the apparatus of FIG. 3A in a second state.

FIG. 3A is a cut-away schematic side view of an apparatus for regulating airflow according to an embodiment in a first state. FIG. 3B is side view of the apparatus of FIG. 3A in a second state. In FIG. 3A, an airflow-regulating duct 300 includes a duct 302 within which an elastically deformable barrier 304 is anchored by an anchor section 305. Deformable barrier 304, when it retracts, changes the size of an opening 306. In FIG. 3A, a fan (not shown) at 40% of maximum RPM creates an air drag 308 that is relatively weak, in comparison to the rigidity of barrier 304. Air drag 308 is a force that results from the combination of the net pressure of the airflow against barrier 304 and the force resulting from the friction of airflow 310 through opening 306. At that 40% RPM and air drag 308, barrier 304 is undeformed and opening 306 is a first size, which results in an airflow 310. In FIG. 3B, with the fan at 100% of maximum RPM, an air drag 314 is created that is relatively strong, in comparison to the rigidity of barrier 304. The increased air drag 314 causes the barrier around opening 306 to elastically deform 312 such that the deformed part of barrier 304 has moved to a retracted position. An airflow 316 results from the increased air drag 314, deformations 312, and the resulting increase in the size of opening 306. Airflow 316 is significantly larger than airflow 310. In the embodiment, should the fan speed be reduced from 100% RPM back to 40% RPM, deformations 312 of FIG. 3B would revert elastically to the configuration of FIG. 3A in which barrier 304 is fully extended into the airflow 310.

FIG. 4 is top view of the apparatus of FIG. 3A employed in server 110 of FIG. 2 operating at an ambient temperature of 25° C. with maximum system GPU and CPU loading and a reduced fan speed of 35% RPM. In FIG. 4, airflow-regulating duct 300 has been installed in the flow path of cooling air 400 downstream from CPU 106 such that flow 400 over CPU 106 is constrained to pass through airflow-regulating duct 300 (see, e.g., FIGS. 10-13 and the related discussion for how the flow might be constrained). In FIG. 4, barrier 304 (FIG. 3A, FIG. 3B) of airflow-regulating duct 300 regulates the redundant airflow, diverting it from CPU 106 to increase flow 200 over GPU 104. As a result, the speed of fans 108 may be decreased to 35% RPM and still maintain the 3° C. margin criteria for both GPU 104 and CPU 106 as well.

Barrier 304 of airflow-regulating duct 300 has been customized with mechanical properties and geometry to accommodate the specific airflow conditions and criteria of the example GPU 104 and CPU 106. For example, at the thermally most-difficult operation condition, e.g., a 45° C. ambient and maximum loading, as shown in FIG. 3B, opening 306 is maximized to provide sufficient airflow sufficient to cool both GPU 104 and CPU 106. Then, at 25° C. ambient and maximum loading, opening 106 is much less (i.e., as shown in FIG. 3A), which restricts airflow 400 through CPU 106 to only the airflow necessary to keep CPU 106 at the 3° C. margin. Hence, excess airflow is diverted over GPU 104 and, by diverting excess airflow from CPU 106 to GPU 104, fan speed may be reduced to 35% RPM.

The GPU and CPU airflows 200 and 400 depend upon the characteristics of fans 108, which may be determined using a fan air volume-static pressure characteristic diagram (a PQ curve). In the embodiment, barrier 304 may employ an elastically-deformable material with a given Young's modulus. Barrier 304 may be dimensioned so that, at a determined low fan speed and corresponding low air drag (e.g., 40% RPM) barrier 304 maintains its non-deformed, extended state (as shown in FIG. 3A). At a determined high fan speed and corresponding higher air drag (e.g., 100% RPM), the same dimensions allow barrier 304 to be deformed by the higher drag so that barrier 304 retracts and allows a greater airflow. Such fluid-structure interaction (FSI) may be modeled using coupled fluid flow computational fluid dynamics (CFD) and solid structure finite element analysis (FEA) as discussed below.

Figure 5A:
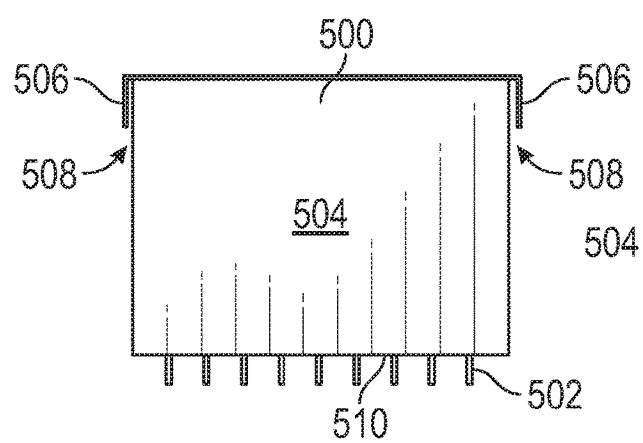
FIGS. 5A-5D are front, side, perspective, and top views, respectively, of an apparatus for regulating airflow according to an embodiment.
Figure 5B:
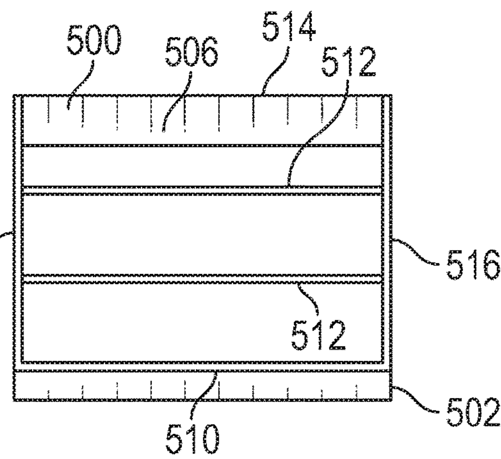
Figure 5C:
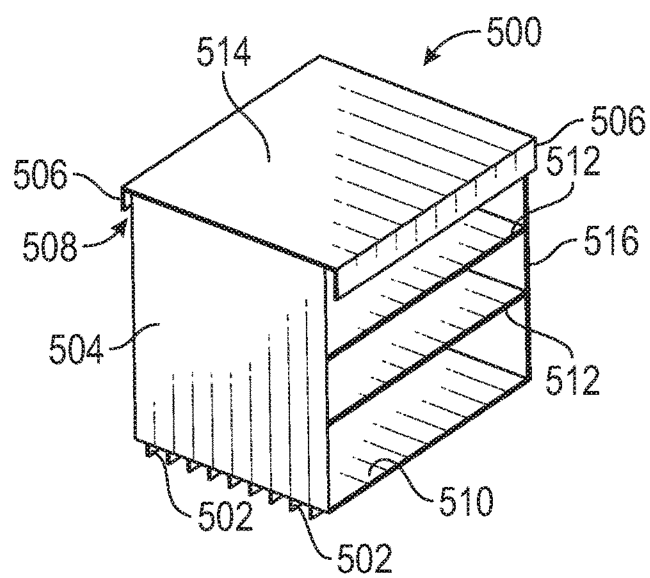
Figure 5D:
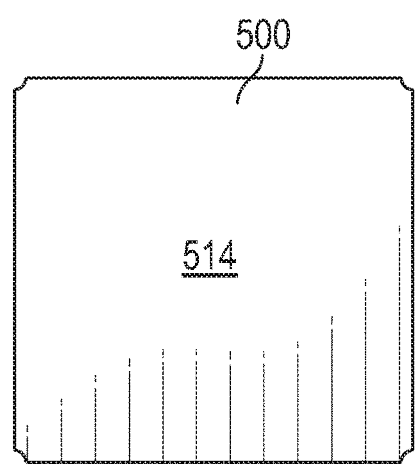

FIGS. 5A-5D are front, side, perspective, and top views, respectively, of an apparatus for regulating airflow according to an embodiment. In FIG. 5A, a deformable barrier 500 includes a leading side 504, a bottom 510, and vanes 502 extending from bottom 510. Barrier 500 may optionally include connector tabs 506 that create slots 508 for use when mounting or positioning barrier 500 within a duct. In FIG. 5B, barrier 500 is shown to further include a top 514 and ribs 512 that connect between leading side 504 and a trailing side 516. Ribs 512 may be constructed of the same elastically deformable material as leading side 504, trailing side 516, bottom 510, and top 514. With barrier 500 anchored within a duct using tabs 506 (such that top 514 and tabs 506 form a type of anchor section) and leading side 504 in the path of cooling flow such that leading side 504 restricts the cooling flow and causes the flow to pass through vanes 502. Such a restriction would occur in two situations: first, when vanes 502 are near or in contact with a side of the duct (e.g., a "side" may include a bottom, a side, or a top of an air flow path); and second, when vanes 502 are opposite vanes of a second deformable barrier (as shown in, e.g., FIGS. 6-8)). Barrier 500 may then elastically deform when pressure is applied to leading side 504 such that bottom 510 swings back and up (as seen in the transition between FIG. 14A and FIG. 14B). By swinging back and raising up, vanes 502 move further from the duct wall, or opposing vanes, which increases the size of the restrictive opening and allows a greater air flow.

In other words, deformable barrier 500 may be placed within a duct (not shown) to obstruct the duct and cause flow to pass between vanes 502. At weaker airflows (e.g., 40% fan RPM or less), the air is forced to go through small channels between vanes 502 extending from bottom 510. Flow through the smaller cross-sectional area between vanes 502 will increase flow velocity and create additional flow resistance. Thus, the flow through vanes 502 may be further regulated by changing both the height of vanes 502 and the length of bottom 510. At stronger airflows (e.g., greater than 40% fan RPM), barrier 500 may be deformed by the force of air pressure against leading side 504 and the drag of flow through vanes 502, causing bottom 510 and vanes 502 to move back and up and allow more airflow to pass.

Figure 6:
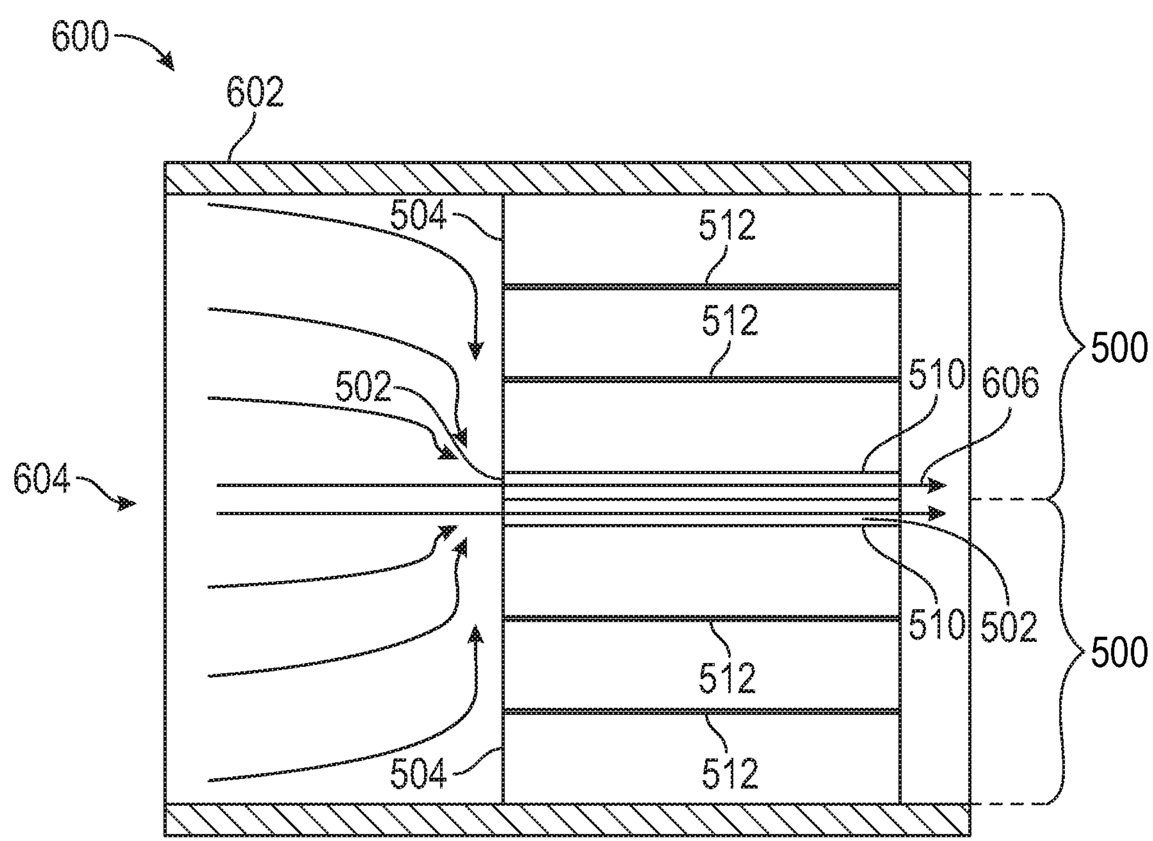
FIG. 6 is a side view of airflow though the embodiment of FIGS. 5A-5D in a first state.

FIG. 6 is a side view of airflow through an embodiment using two barriers 500 in a first state. In FIG. 6, a deformable barrier 600 includes two opposed barriers 500 fixed within a duct 602 at their respective "top" or "anchoring" sides. An air drag 604 exerts a pressure against both leading sides 504. As barriers 500 have not deformed, vanes 502 provide channels through which a flow 606 may pass. In FIG. 6, air drag 604, including the drag of flow 606 against vanes 502 and bottoms 510, is not yet enough to cause barriers 500 to deform. If air drag 604 were increased, at some point it would be enough to cause the arrangement of leading side 504, ribs 512, bottom 510, and trailing side 516 to deform, allowing bottom 510 to swing to the right and up, retracting the opposing sets of vanes away from each other, and providing a larger opening through which flow 606 may pass (see FIG. 14B).

Figure 7:
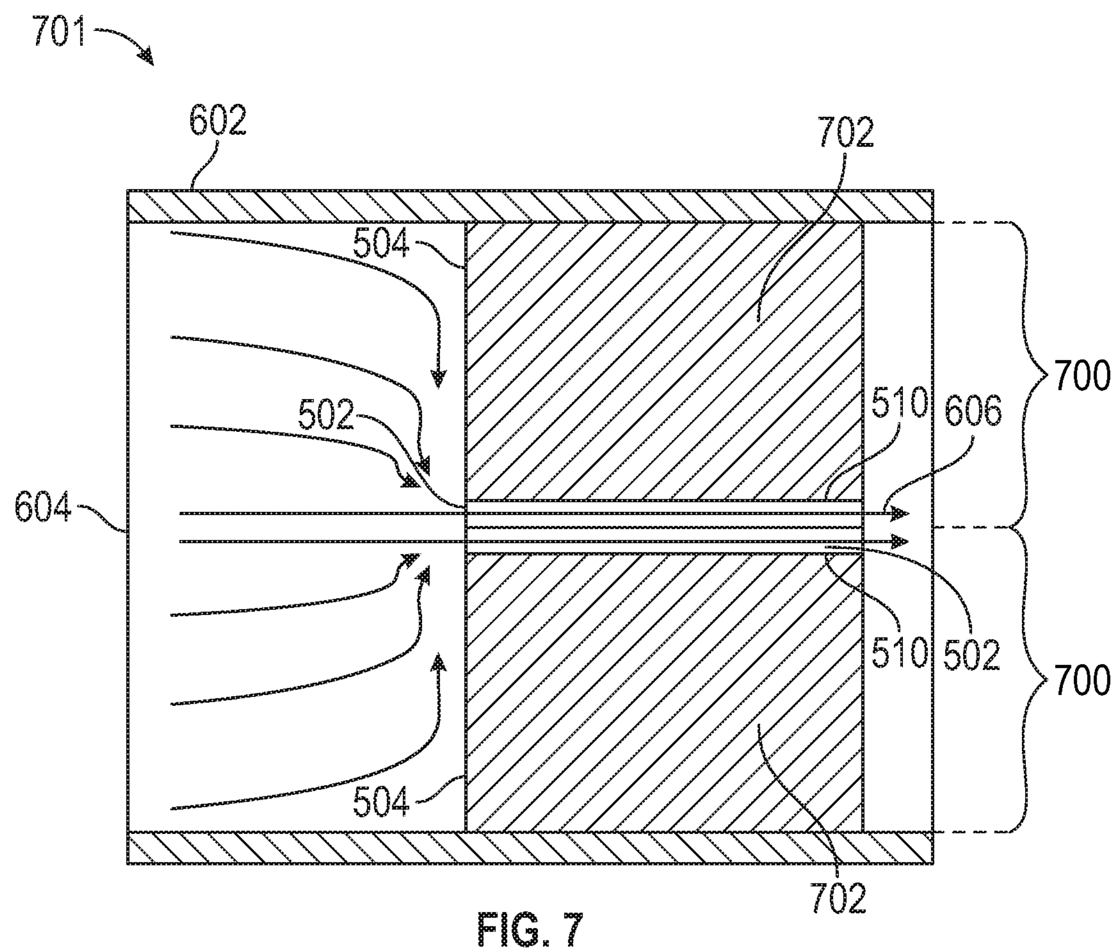
FIG. 7 is a side view of airflow through an embodiment of an apparatus for regulating airflow in a first state.

FIG. 7 is a side view of airflow through an embodiment of an apparatus for regulating airflow in a first state. In FIG. 7, a deformable barrier 701 includes two opposed barriers 700 fixed within a duct 602 at their respective "top" or "anchoring" sides. Each barrier 700 includes an inner lattice 702 between leading side 504, bottom 510, trailing side 516 and top 514. Lattice 702 may be, e.g., a low density foam or a pressurized bladder that works to maintain the shape of barrier 700 against air drag 604, including the drag of flow 606 through vanes 502. In FIG. 7, as in FIG. 6, air drag 604 exerts a pressure against both leading sides 504. As barriers 504 have not deformed, vanes 502 provide channels through which flow 606 may pass. In FIG. 7, air drag 604 is not yet enough to cause barriers 500 to deform. If air drag 604 were increased, at some point it and the drag of flow 606 would be enough to cause lattice 702 to elastically deform, allowing bottoms 510 to swing to the right and up, retracting the opposing sets of vanes away from each other, and providing a larger opening through which flow 606 may pass (see FIG. 14B).

Figure 8:
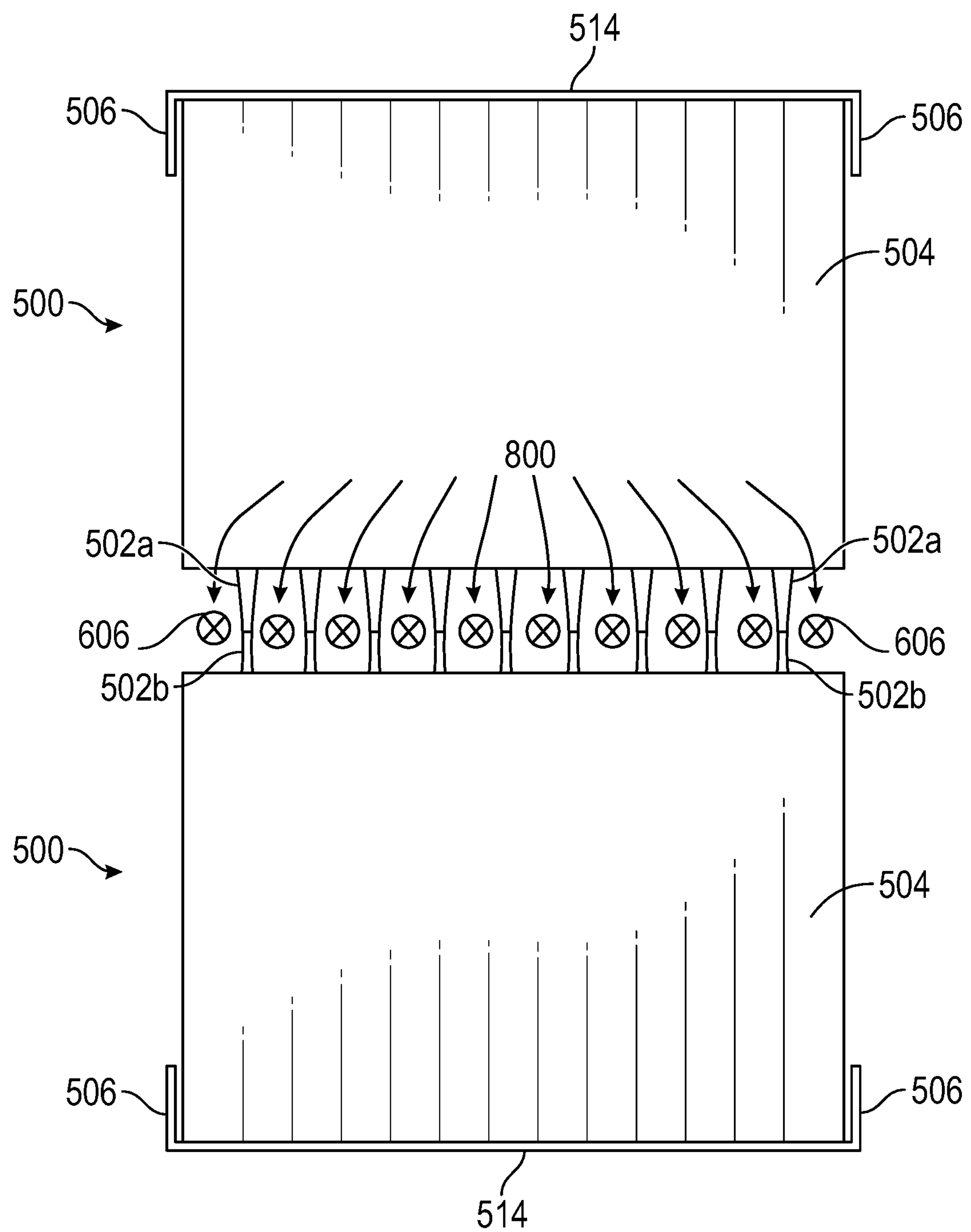
FIG. 8 is a front view of airflow through an embodiment of an apparatus for regulating airflow in a first state.

FIG. 8 is a front view of airflow through an embodiment of an apparatus for regulating airflow in an undeformed first state. In FIG. 8, channels 800 are created by vanes 502*a* being in proximity to opposing vanes 502*b*. FIG. 8 depicts the view in line with flow 606 of the embodiments of both FIG. 6 and FIG. 7 in the first, undeformed state. In FIG. 8, if air drag 604 were increased, at some point it would be enough to cause barrier 500 to elastically deform, allowing bottoms 510 to swing back, retracting the opposing sets of vanes 502*a*, 502*b* away from each other, and providing a larger opening through which flow 606 may pass (see FIG. 14B for an illustration of how vanes 502 part after air pressure is increased sufficiently).

As shown by the length of the path of flow 606 through barrier 600 (FIG. 6) and 701 (FIG. 7) and by the channels 800 in FIG. 8, in embodiments the size of the flow path in the first, undeformed state, may be adjusted to react to increased flow using two aspects: 1) the geometry of channels 800 in terms of their area and length (or, together, the hydraulic diameter of a channel 800); and 2) the area of leading sides 504 and thickness of barriers 500. Flow 606 through channels 800 causes drag against vanes 502, and pressure against leading sides 504 urge them in the opposite direction. The sum of these forces and pressure against leading side 504 cause vanes 502 and bottom section of leading side 504 to retract, or recede backwards, which causes vanes 502*a* to separate from vanes 502*b*.

In embodiments, barriers such as barrier 600 and 701 may be configured and constructed of a material with an elasticity (our Young's Modulus) in which the configuration and elasticity determine the deformation behavior of the barrier. In other words, the configuration and material may be chosen to determine the air pressure at which the initial restrictive opening begins to enlarge. Similarly, the construction and configuration may be chosen to determine the air pressure at which the restriction is fully enlarged. Thus, embodiments may be developed in which there is a range of air pressures at which the restriction of the barrier changes from an initial relatively small restrictive opening to a larger, less restrictive opening. Generally, with regard to FIG. 6, for the same material, the thinner the thickness of a given side (leading, trailing) or the connecting sides (top, bottom, rib) the easier it bends under a specific airflow. Thus, the configuration and material of a barrier may be varied to suit the requirements of servers with different cooling flow paths and different heat-generating components. Similarly, with regard to FIG. 7, the elastic properties of the lattice may be varied in embodiments.

Figure 9:
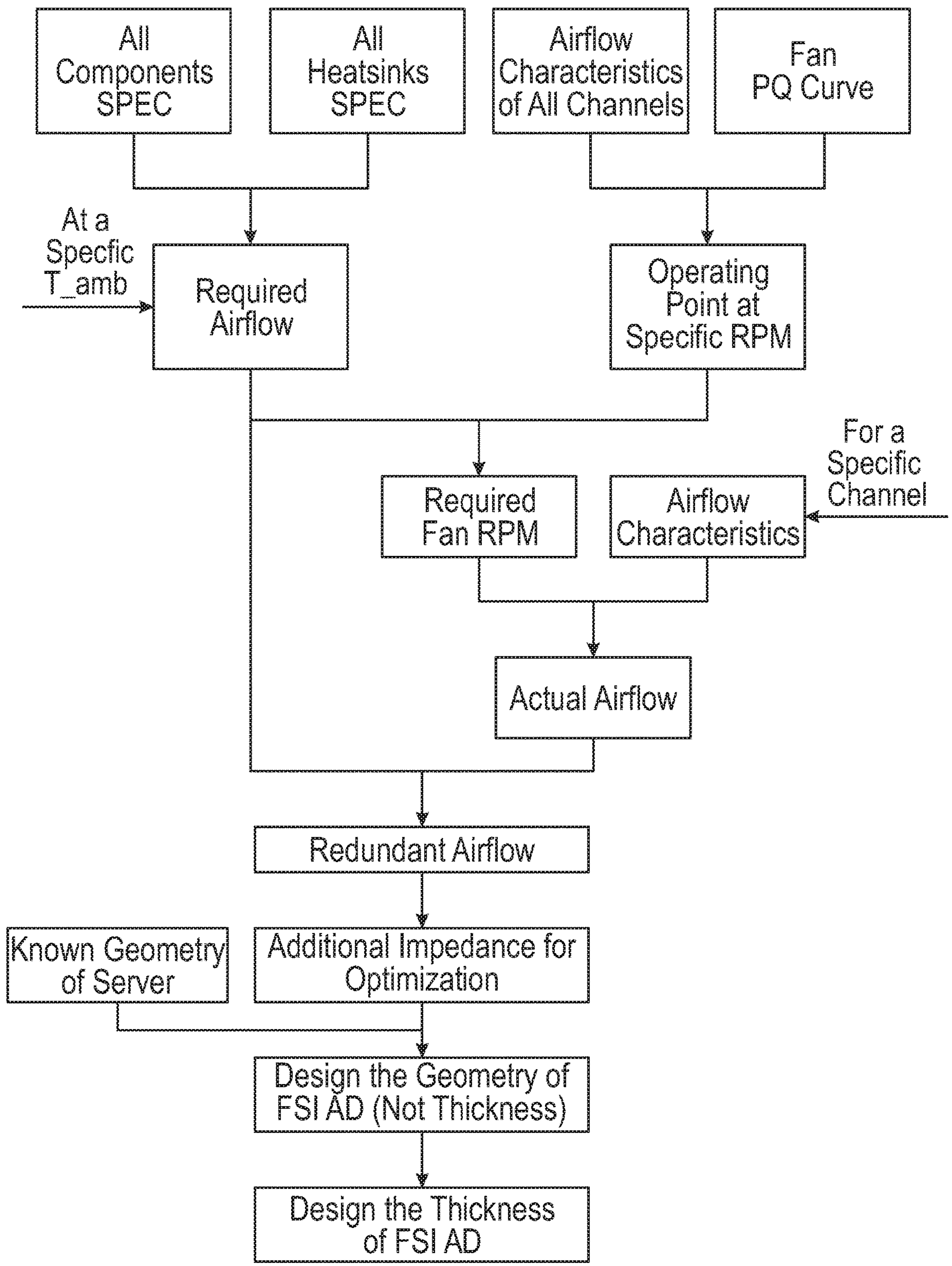
FIG. 9 is a flow chart of an embodiment of a design sequence for determining the configuration of embodiments of an apparatus for regulating airflow.

FIG. 9 is a flow chart of an embodiment of a design sequence 900 for determining the configuration of embodiments of the restrictive barrier. Because different servers may have different flow and thermal characteristics, the design of a restrictive barrier (or barriers) may be unique to a server. In first steps 901, 902 the thermal characteristics of the components and associated heat sinks are determined. These allow, in step 903, for the determination of the airflows required at specific ambient temperatures for each component (e.g., 27.8 CFM at 45° C. ambient for a TESLA V1O0 PCie GPU Accelerator, SP-08654-001-v4, September 2017). In steps 904, 905 the airflow characteristics of the server channels are determined, as is the fan PQ curve. From the airflows and PQ curve, in step 906, the operating points (where an operating point is the air flow and impedance at a specific fan RPM) are determined. In step 907, the minimum fan RPM required at any given ambient condition may be determined from the required airflows 903 and the operating points 906. With the required fan RPM and airflow characteristics for a specific channel 908 (determined in preparation of step 904), in step 909, and for any specific channel (e.g., CPU or GPU), the actual airflow can be calculated. In step 910, the actual airflow is compared to the required minimum airflow 903 to determine whether the specific channel has any redundant airflow. This redundant airflow is, in step 911, designated as the target for regulation (or optimization) by adding a restrictive barrier to the channel to create additional impedance and reduce the airflow through that specific channel. Since, as indicated by step 912, the server geometry is known, in step 913, a geometry of the restriction of the restrictive barrier for the specific channel may be customized in the area and depth of barrier 500, including the depth, cross-sectional area, and channel hydraulic diameter of channels 800. With the design of the leading side 504, vanes 502, and associated channels (e.g., channels 800) in hand, in step 914, the material and configuration used to control the elastic deformation of the restrictive barrier may be completed (e.g., the material and thicknesses or other configuration of leading side, trailing side, top, bottom, ribs, and lattice). These dimensions and materials may be determined using a combination of solid mechanics, fluid mechanics, empirical correlation, and subsequent simulation of the prospective design. For example, a prospective design may be simulated using a self-compiled program or a commercial code, such as ANSYS. In sum, the design of a restrictive barrier is based on the following information: 1) the geometry of the server; 2) the major components' thermal and flow characteristics; and 3) fan performance (PQ Curve).

Figure 10:
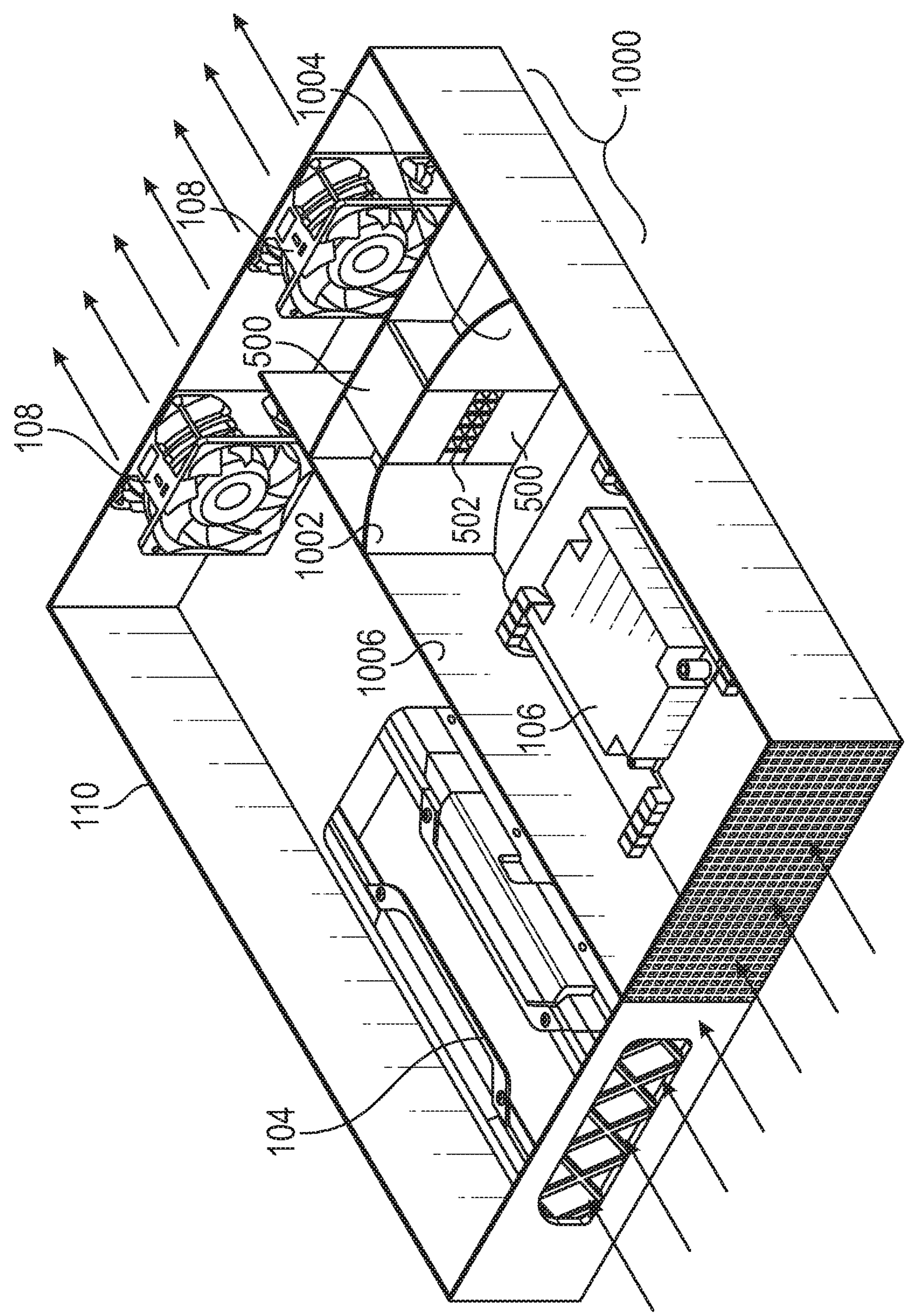
FIG. 10 is a perspective view of an embodiment of an apparatus for regulating airflow incorporated into an exemplary system.

FIG. 10 is a perspective view of an embodiment of an apparatus for regulating airflow incorporated into an exemplary system. In FIG. 10, a deformable barrier assembly 1000 includes a right air guide 1002 and a left air guide 1004 on either side of a pair of deformable barriers 500 (described earlier with regard to FIGS. 5A-5D and FIG. 6). The top of server 110 is removed for clarity. Barrier assembly 1000 is positioned within server 110 between an inner divider 1006 and the server case. Inner divider 1006 does not extend fully to intersect the server case between fans 108. Thus, fans 108 combine to cause the flows over both GPU 104 and CPU 106. In other words, the flow over a component cannot be attributed to a specific fan. In this position, barrier assembly 1000 is downstream from CPU 106 in the airflow caused by fans 108 and fully spans the flow path between barrier 1006 and the outer server case, with most of the span blocked by right air guide 1002 and left air guide 1004. Thus, the flow over CPU 106 must pass through vanes 502 of opposing barriers 500. In embodiments of barrier assembly 1000, other forms of the deformable barrier may be used, e.g., airflow-regulating duct 300 and barrier 700, and other configurations of air guides may be used.

Figure 11:
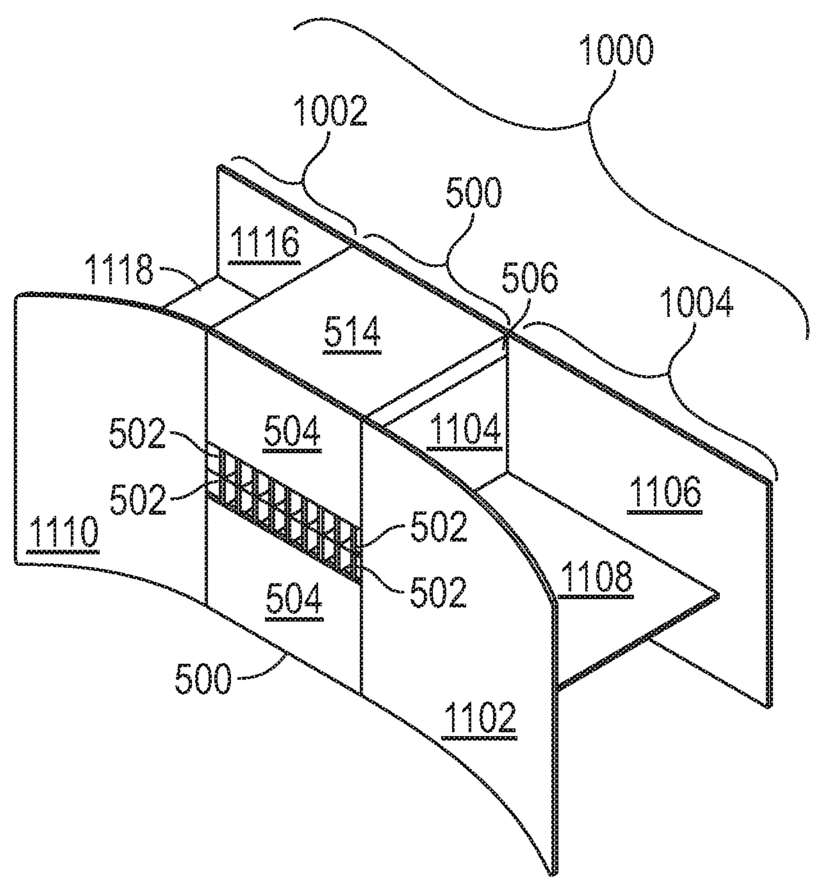
FIG. 11 is a perspective view of the embodiment of FIG. 10.

FIG. 11 is a perspective view of an embodiment of the deformable barrier assembly 1000 for regulating airflow. In FIG. 11, left air guide 1004 includes a guide face 1102 and a guide brace 1108 between face 1102 and a guide rear wall 1106. Left air guide 1004 includes an inner face 1104, which is attached to barrier 500 at an upper edge by sliding under connector tab 506. Inner face 1104 is continuous between the top edge of guide face 1102 and the bottom edge. Thus, inner face 1104 provides a left-most boundary to the opening provided between vanes 502 when they are forced back and apart by increased air flow. In the same manner, right air guide 1002 includes a guide face 1110 and a guide brace 1118 between face 1110 and a guide rear wall 1116. Right air guide 1002 also includes an inner face (not shown), which is attached to barrier 500 at an upper edge by sliding under connector tab 506. Barriers 500 are attached to right air guide 1002 in a similar manner, as will be illustrated with regard to FIG. 12. Right and left air guides 1002, 1104 are preferably designed to smoothly channel the flow of air to vanes 502

Figure 12:
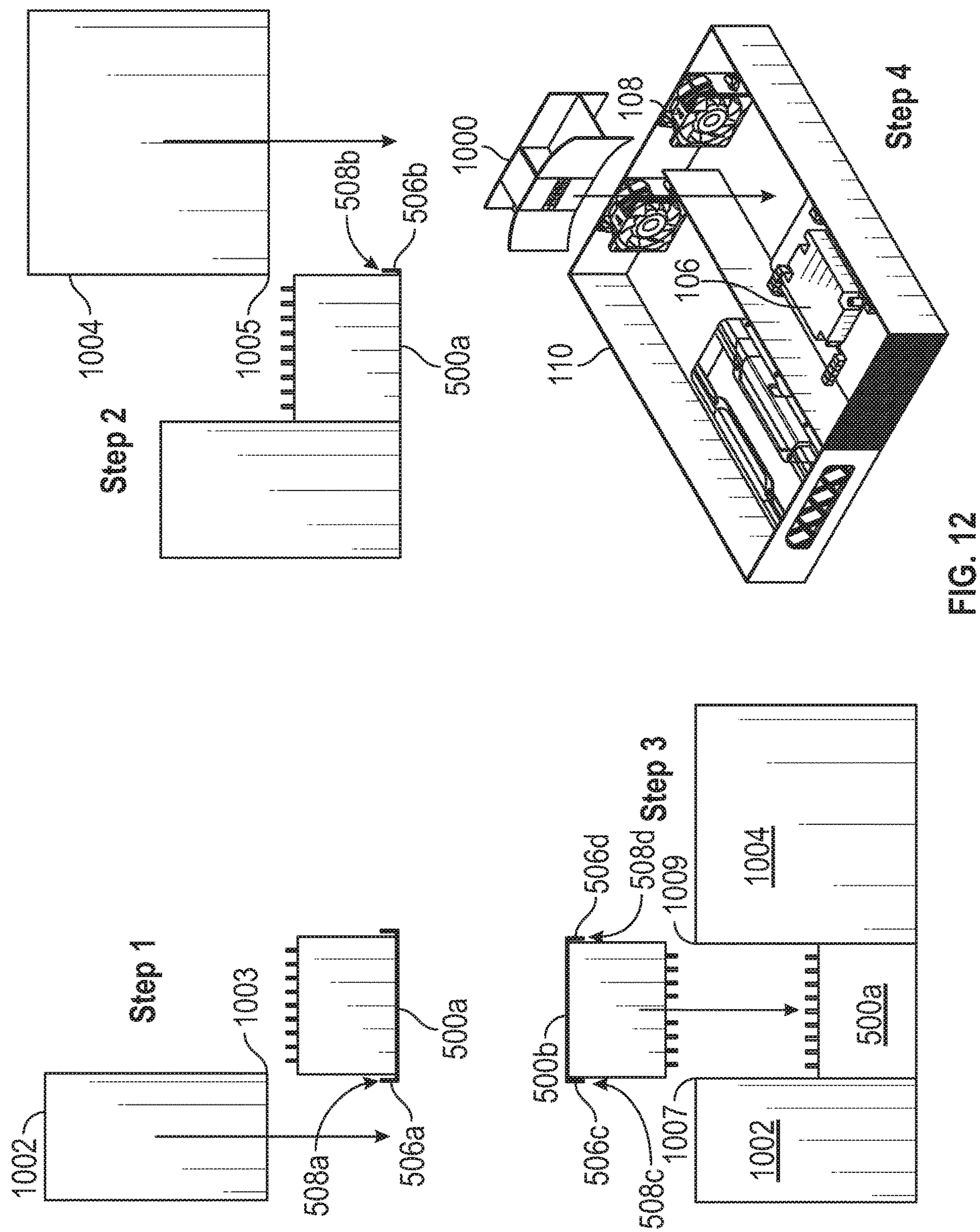
FIG. 12 is an illustration of steps of an embodiment of a method for assembling and installing the embodiment of FIG. 10.

FIG. 12 is an illustration of steps of an embodiment of a method for assembling and installing deformable barrier 1000. In step 1, a lip 1003 of right air guide 1002 is lowered down into slot 508*a* of barrier 500*a*. In step 2, a lip 1005 of left air guide 1004 is lowered down into slot 508*b* of barrier 500*a*. This positions the inner guide faces of air guides 1002 and 1004 on either side of vanes 502, constraining air to flow between left and right air guides 1004, 1002. In step 3, barrier 500*b* is lowered down so that lips 1007 and 1009 slide into slots 508*c* and 508*d*. In the embodiment, the inner faces of air guides 1002 and 1004 do not prevent barriers 500*a* and 500*b* from flexing, allowing vanes 502 to move back and apart when forced by increased air flow. In other words, barriers 500*a*, 500*b* are fixed in position by their top faces, connector tabs, and slots, to right and left air guides 1002, 1004, but are otherwise free to flex. In step 4, the assembled deformable barrier 1000 is installed at the desired location inside server 110. In deformable barrier assembly 1000, the design of barriers 500*a*, 500*b* may be achieved using the method discussed with regard to FIG. 9. The geometry of left and right air guides 1002, 1004 are then based on the designs of barriers 500*a*, 500*b* and the geometry of server 110 and the flow channel of interest. In embodiments, left and right air guides may be asymmetric.

In an embodiment, the maximum deformation of the barrier may be limited by installing a limiting structure, e.g., a set of vertical ribs, downstream of the barrier. Thus, the rear-ward travel of vanes 502 may be limited by the position of the limiting structure.

Figure 13:
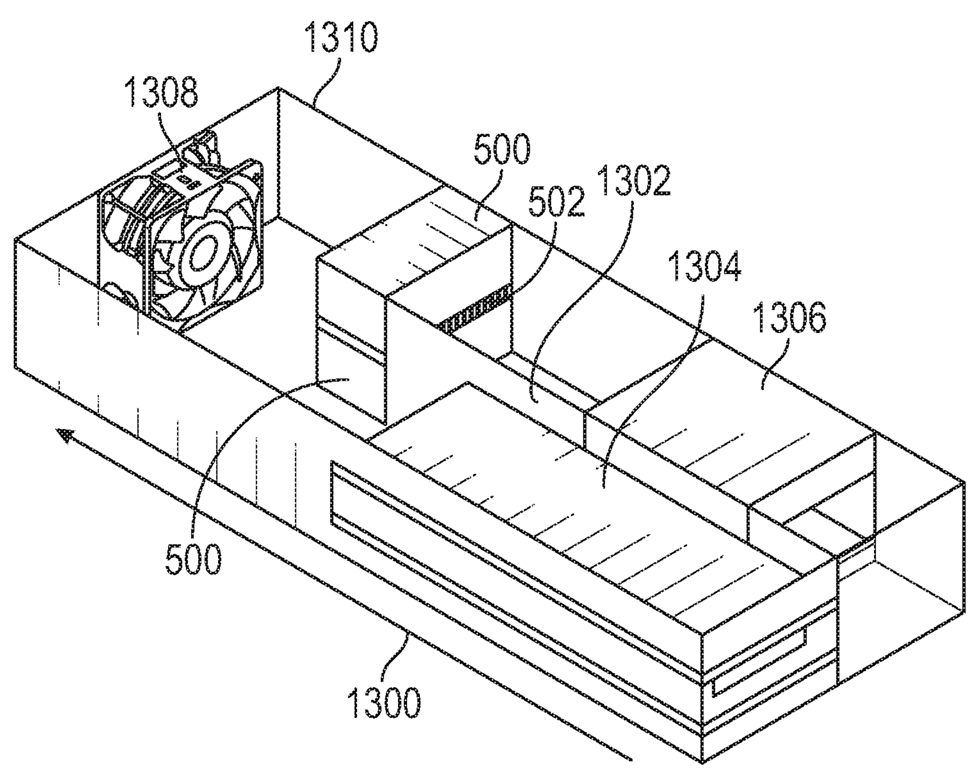
FIG. 13 is a perspective view of an embodiment of an apparatus for regulating airflow incorporated into an exemplary system.

FIG. 13 is a perspective view of an embodiment of an apparatus for regulating airflow incorporated into an exemplary system. In FIG. 13, a server 1310 includes an inner divider 1302, dividing an internal airflow (the direction indicated by an external arrow 1300) caused by a fan 1308 between a GPU 1304 and a CPU 1306. The top of server 1310 is not shown for clarity. FIG. 13 illustrates that in embodiments deformable barriers 500 may be sized so that air guides as shown in FIGS. 10-12 are not necessary.

Figure 14A:
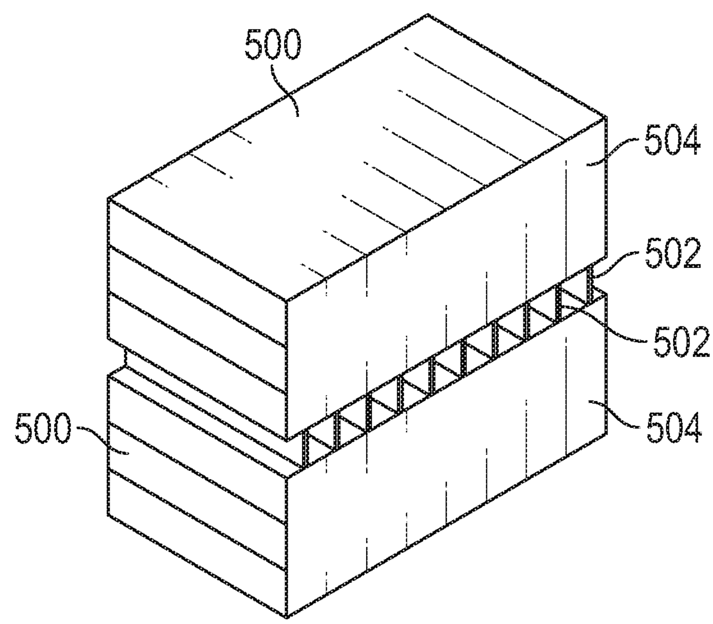
FIG. 14A is a perspective view of an embodiment of an apparatus for regulating airflow in a first state.
Figure 14B:
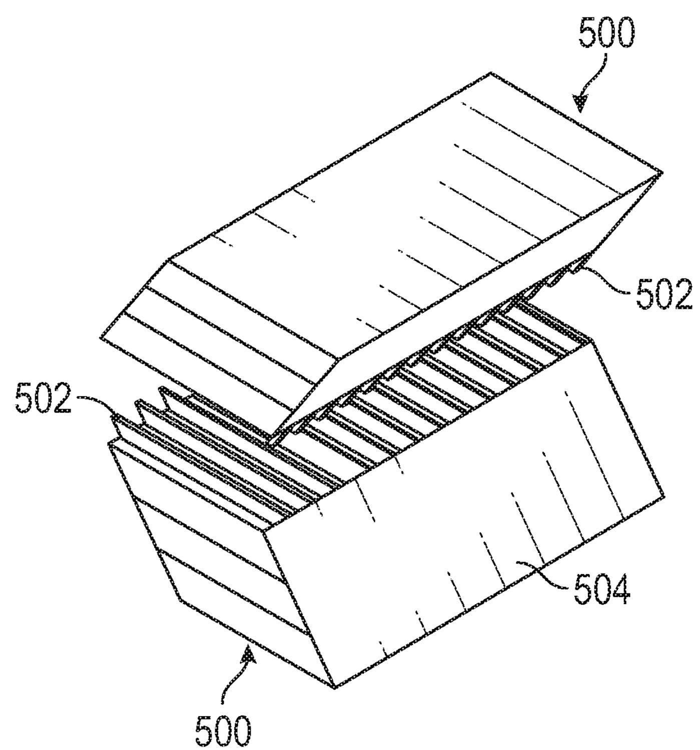
FIG. 14B is a perspective view of the embodiment of FIG. 14A in a second state

FIG. 14A is a perspective view of an embodiment of an apparatus for regulating airflow in a first state and FIG. 14B is a perspective view of the embodiment of FIG. 14A in a second state. FIGS. 14A and 14B illustrate the deformation a barrier, e.g., barrier 500 or barrier 700, undergoes between the first state shown in FIG. 14A and the second state shown in FIG. 14B. In FIG. 14A, the forces exerted against faces 504 and vanes 502 have not yet reached the level that causes barriers 500 to deform. In FIG. 14A, barriers 500 were designed to maintain the undeformed state shown when installed in the server of FIG. 13 and for fan speeds of 40% maximum RPM or less. In FIG. 14B, the combined airflow forces of pressure against faces 504 and drag against vanes 502 have caused vanes 502 to move away from the flow. In FIG. 14B, barriers 500 were designed to achieve the deformed state shown when installed in the server of FIG. 13 and for fan speeds of 90-100% maximum RPM. Since barriers 500 are constrained at their respective "tops" (e.g., where barriers 502*a*, 502*b* attach to left and right air guides 1002, 1004 in FIGS. 10-12), the retraction of vanes 502 causes vanes 502 to swing both back and up (toward their respective "top" sides), which causes them to retract from each other and create a larger opening between the upper and lower sets of vanes 502.

In an embodiment, a deformable barrier adjusts an air pathway opening by deforming due to increased drag forces caused by increased airflow intensity. In an embodiment, one or more deformable barriers may be used to optimize the distribution of airflow at a range of operating conditions among the components of a system. In an embodiment, the optimization of airflow distribution may permit fan RPM to be lowered for one or more of the operating conditions, reducing energy costs and noise levels.

Figure 15:
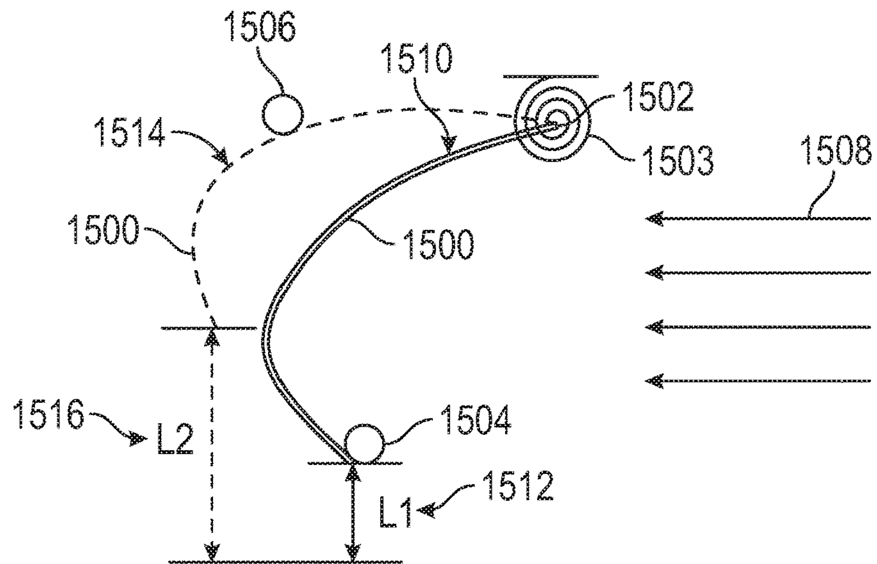
FIG. 15 is a schematic side view of an embodiment of an apparatus for regulating airflow.

FIG. 15 is a schematic side view of an embodiment of an apparatus for regulating airflow. In FIG. 15, a curved flap 1500 pivots about a pivot point 1502. Flap 1500 is limited in a lower position 1510 by a pin 1504. In lower position 1510, flap 1500 leaves an opening 1512 for airflow 1508. Flap 1500 is limited in an upper position 1514 by a pin 1506. In upper position 1514, flap 1500 leaves a larger opening 1516 for airflow 1508. In the embodiment, flap 1500 may be biased by a spring 1503 about pivot 1502 such that flap 1500 remains against pin 1504 when airflow 1508 is at or below a certain strength. When airflow 1508 becomes strong enough to overcome the bias, flap 1500 begins to pivot about pivot point 1502 such that the gap provided for airflow 1508 increases. As airflow 1508 continues to increase, at some point flap 1500 will contact point 1506, which prevents further travel. In an embodiment, flap 1500 may be biased toward pin 1504 by a spring, with the spring force designed to hold flap 1500 against pin 1504 up to a predetermined airflow 1508 associated with a first fan PWM setting, e.g., the airflow caused by a fan PWM setting of 35%. In an embodiment, the biasing spring may be further designed so that flap 1500 comes into contact with pin 1506 at a predetermined airflow 1508 associated with a second fan PWM setting, e.g., the airflow caused by a fan PWM setting of 100%. Thus, flap 1500 may be designed to move between pins 1504, 1506 for fan settings between the first and second PWM settings (e.g., fan PWM settings between 35% and 100%) as a result of the change in airflow, only, and without additional control input.

Figure 16A:
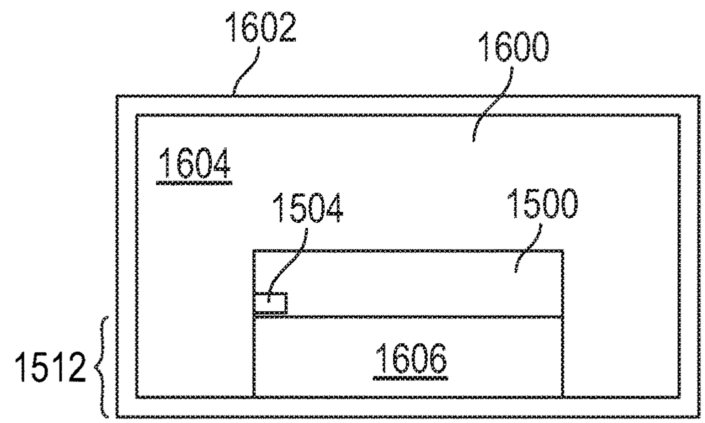
FIG. 16A is an illustration of the embodiment of FIG. 15 in a first state.
Figure 16B:
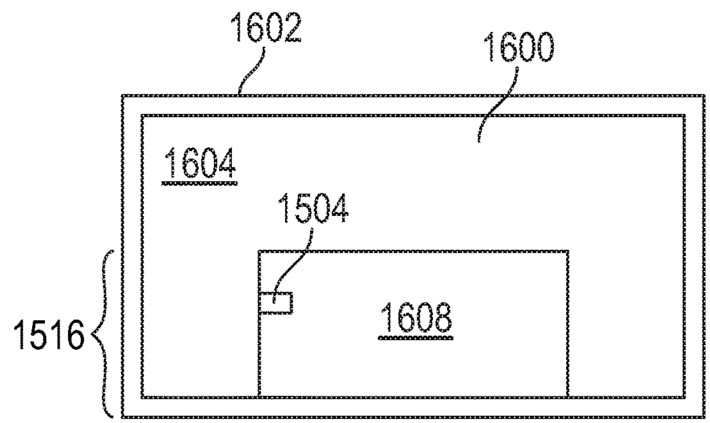
FIG. 16B is an illustration of the embodiment of FIG. 15 in a second state.

FIG. 16A is an illustration of the embodiment of FIG. 15 in a first state and FIG. 16B is an illustration of the embodiment of FIG. 15 in a second state. In FIG. 16A, flap 1500 is incorporated into mother-barrier assembly 1600 for regulating airflow that includes a fixed barrier 1604. Mother-barrier assembly 1600 is positioned within an airflow channel 1602. In the first state, shown in FIG. 16A, flap 1500 rests against pin 1504 and leaves an opening 1606 for airflow. This first state corresponds to a state of reduced air flow, as shown in FIG. 15 and lower position 1510. In the second state, shown in FIG. 16B, flap 1500 has lifted off 1504 and is completely recessed behind fixed barrier 1604, leaving an opening 1608 for airflow. This second state corresponds to a state of increased air flow, as shown in FIG. 15 and upper position 1514.

In an embodiment, the spring of FIG. 15 may be replaced by an elastic material that biases flap 1500 against pin 1504 for the airflow conditions described. In an embodiment, a pair of flaps 1500 may be employed to regulate airflow within a duct as described above with, e.g., barriers 304, 500, and 700.

It is understood that any specific order or hierarchy of steps in the processes disclosed is an illustration of approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:

a first barrier including a first anchor section and a first moving section, the first barrier configured to be fixed in position using the first anchor section, the first moving section including: a first leading side, a first trailing side, and a first bottom connected between a first end of the first leading side and a first end of the first trailing side such that a space is created between the first leading side and the first trailing side, wherein:

the first leading side is connected to the first anchor section at a second end of the first leading side;

the first trailing side is connected to the first anchor section at a second end of the first trailing side; and the first moving section is configured to move, in response to pressure applied to the first leading side, between a first extended position and a first retracted position such that a path for a flow is larger in the first retracted position than in the first extended position.

2. The apparatus of claim 1, wherein the first moving section is configured to:

maintain the first extended position for applied pressures below a first pressure, and move between the first extended position and the first retracted position for applied pressures in a range of pressures above the first pressure.

3. The apparatus of claim 2, wherein: the first leading side and first trailing side include elastic material; and the first leading side and the first trailing side deform elastically to permit the first moving section to move between the first extended position and the first retracted position in response to applied pressures within the range of pressures.

4. The apparatus of claim 3, the first bottom further including a first plurality of vanes extending from the first bottom and spaced apart permitting air to flow between the first vanes and along the first bottom.

5. The apparatus of claim 4, further comprising:

a second barrier including a second anchor section and a second moving section, the second barrier configured to be fixed in position using the second anchor section, the second moving section including a second leading side, a second trailing side and a second bottom connected between a first end of the second leading side and a first end of the second trailing side, the second leading side and second trailing side including elastic material and the second bottom further including a second plurality of vanes extending from the second bottom and spaced apart permitting air to flow between the second vanes and along the second bottom, wherein:

the second leading side is connected to the second anchor section at a second end of the second leading side;

the second trailing side is connected to the second anchor section at a second end of the second trailing side;

the second moving section is configured to move, in response to pressure applied to the second leading side, between a second extended position and a second retracted position such that the path for the flow is larger in the second retracted position than in the second extended position;

the second leading side and the second trailing side deform elastically to permit the second moving section to move between the second extended position and the second retracted position in response to applied pressures within the range of pressures;

the second moving section is configured to maintain the second extended position for applied pressures below a second pressure and move between the second extended position and the second retracted position for applied pressures in a range of pressures above the second pressure; and the first barrier and the second barrier are oriented such that the path for the flow is between the first bottom and the second bottom.

6. The apparatus of claim 1, the first moving section including an elastic material, the elastic material flexing in response to pressure applied to the first leading side to permit the movement between the first extended position and the first retracted position.

7. The apparatus of claim 1, the first barrier further including a pressurized bladder opposing movement toward the first retracted position.

* * * * *